United States Patent
Farrar et al.

(10) Patent No.: US 7,408,403 B2
(45) Date of Patent: Aug. 5, 2008

(54) CIRCUITS AND METHODS FOR AMPLIFYING SIGNALS

(75) Inventors: Douglas M. Farrar, Los Altos, CA (US); Wendell B. Sander, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 67 days.

(21) Appl. No.: 11/450,026

(22) Filed: Jun. 9, 2006

(65) Prior Publication Data
US 2007/0257732 A1    Nov. 8, 2007

Related U.S. Application Data

(60) Provisional application No. 60/797,978, filed on May 5, 2006.

(51) Int. Cl.
*H03F 3/38*    (2006.01)

(52) U.S. Cl. .......................... 330/10; 330/297

(58) Field of Classification Search ............... 330/10, 330/251, 207 A, 297
See application file for complete search history.

(56) References Cited

U.S. PATENT DOCUMENTS 6,091,292 A * 7/2000 Higashiyama et al. ......... 330/10
6,166,596 A * 12/2000 Higashiyama et al. ......... 330/10

* cited by examiner

*Primary Examiner*—Henry K Choe
(74) *Attorney, Agent, or Firm*—Blakely, Sokoloff, Taylor & Zafman LLP

(57) ABSTRACT

The present invention discloses a bus pumping compensation for a pulse modulation circuit such as class D modulators. The compensation according to the present invention provides a compensation current controlled by the output voltage, with the compensation characteristics matching the reverse current for improving circuit efficiency. Embodiments of the present invention also disclose a designable compensation circuit, comprising a linear compensation current, offering a good trade-off between circuit efficiency and ease of design. The present invention compensation circuit is preferably employed in a class D amplifier with substantial reverse current, and most preferably added into a LDO power supply in a class D amplifier circuit to prevent reverse current problem. The disclosed class D amplifier circuit is preferably used in an audio media player.

26 Claims, 8 Drawing Sheets

CIRCUITS AND METHODS FOR AMPLIFYING SIGNALS

This application claims priority to U.S. Provisional Patent Application No. 60/797,978 filed on May 5, 2006. This application claims the benefit of the provisional's filing date under 35 U.S.C. § 119(e), and said provisional application is hereby incorporated herein by reference.

FIELD OF THE INVENTION

The present invention relates generally to compensation circuitry in electronic circuits and devices and more particularly to a power supply compensation circuit in class D modulators.

BACKGROUND OF THE INVENTION

Amplifiers traditionally have been linear, including various variations of class A, class B and class AB, with power output transistors acting as linear regulators to modulate the output voltage. A recent development in high efficiency amplifier design is the class D amplifier, which is basically a switching amplifier with the switches either fully on or off, thus significantly reducing the power losses in the power output devices.

For analog inputs, a class D amplifier operates by first converting the input into a modulated digital signal, which then is amplified, and then is filtered to recover an analog output signal. In the class D amplifier, only the digital signal is amplified by on/off digital signal processing, thus, class D amplifiers can have very high power efficiency since they provide substantially full output power, while minimizing internal power consumption.

FIG. 1 shows a prior art typical class D amplifier, comprising a comparator 13, a sawtooth waveform generator 12, a class D switching stage 15, a filter 17 and a load 19. An input Vi 10 is first compared (in the comparator 13) with a sawtooth comparator signal 11 (generated by the sawtooth generator 12) to generate a digital modulated signal 14. The modulated signal 14 is composed of a series of pulses, with the width of each pulse being proportional to the amplitude of the input voltage Vi. The modulated signal 14 is then used to drive a class D switching stage 15, generating a modulated digital signal 16. After passing through the low-pass filter 17, the digital signal 16 is converter back to an analog signal Vo 18, with amplified magnitude, to drive a load 19. A class D amplifier typically includes the class D switching stage 15 and the filter 17.

One important component of class D amplifiers is the modulation circuitry. A popular class D modulator, Pulse Width Modulation (PWM), provides a constant frequency pulse signal whose pulse width varies proportionally to the input signal. Other class D modulation techniques can also be used, such as pulse density modulation (PDM), or pulse frequency modulation (PFM). An indispensable component of class D amplifiers is the low-pass filter, typically an LC-type low-pass filter.

There are basically two class D topologies, a half-bridge with 2 output devices and a full-bridge with 4 output devices. The half-bridge design is simpler and more flexible, but can exhibit a "bus pumping" phenomenon where supply current sinks back to the power supply from the amplifier. Such changes in current direction are problematic for Low Dropout (LDO) voltage regulators, which can source current but are usually incapable of sinking current. Any standard LDO that is presented with a reverse (sink) current rather than a source current will respond by shutting off, and its output voltage will rise dramatically, usually above the LDO's input voltage. LDO "regulation" is then lost, resulting in the complete loss of the class D amplifier's output voltage regulation.

Various prior art conventional solutions exist to eliminate the problems associated with class D reverse current. However, these solutions are not universally accepted since no solution is suitable for all design limitations. An obvious prior art solution is the use of a battery to power the class D amplifier where the reverse current operates to charge the battery. The design limitation of this solution is that not all class D amplifier topologies are intended to operate from the unregulated battery voltage, relying instead on a well-controlled voltage (LDO) source. Another solution is the incorporation of a large capacitor capable of recovering the energy going back into the power supply. The major drawback of this solution is the extra space needed since a large capacitor takes up a significant real estate in a system floor plan. Another solution is to take advantage of any other power requirements in the overall system by supplying the class D amplifier power from the same power source. For example, if the rest of the system consumes 20 mA, and if the maximum reverse current is only 10 mA, then a power supply supplying the total power will always see a net drain of current, and thus will be stable. A drawback of this solution is the vagaries of system load currents. One more solution is to simply add a resistor between the output of the power supply and ground, whose value sinks a current larger than the anticipated reverse current from the class D amplifier. The main disadvantage of this approach is that the LDO must then continually source this current, wasting system power.

Still another solution is the use of differential loading. FIG. 2 shows a schematic of this solution, where one of the paths is always providing a forward current, and if the forward current always exceeds the reverse current, then the net current is always forward. The problem with this solution is that it is not an available option if the load is inherently single ended as in the case of conventional headphone. Another solution is a push-pull voltage source, shown in FIG. 3, which is a regulated voltage source (Vs) that is capable of both sourcing and sinking current. The reverse current in this voltage source is designed to be shunted to ground instead of capturing in a storage element or using for other useful purpose. The efficiency of the overall circuit is reduced somewhat due to the disposal of the reverse current. Beside the loss of efficiency, another drawback of this design is the special design of the power supply to allow the sinking of reverse current.

SUMMARY OF THE DESCRIPTION

Embodiments of the present invention disclose a compensation method and circuit for a pulse modulation circuit, especially for class D modulators, to compensate for the reverse current of the power supply. The compensation according to at least certain embodiments of the present invention provides a compensation current controlled by the output voltage of the modulator for improving operation.

One embodiment of the present invention thus comprises a modeling of the reverse current from the modulator, and then designing a compensation circuit having essentially the same voltage dependent characteristics, but with a reverse polarity, as the reverse current. With the reverse current being a function of the output load voltage amplitude and polarity, the compensation circuit can be designed to match the reverse current of a particular modulator circuitry, resulting in minimizing power loss due to overcompensation.

The similarity of the voltage dependent characteristics of the compensation current can cover the whole range of operating voltages for optimum efficiency, and preferably match only the shape and the amplitude for a pre-determined range of operating voltages for ease of circuit design.

In another embodiment, the present invention also discloses a universal compensation circuit, suitable for many modulator circuits with designable components. The disclosed compensation circuit provides a gradually-sloped stepping compensation current, comprising a zero compensation current when there is no reverse current, a constant compensation current in the voltage range of maximum reverse current, and a gradually transition current, connecting the other two currents. The zero compensation current is preferably corresponding to the positive output voltage range of the modulator. The constant compensation current is preferably matched to the maximum reverse current, and the switchover preferably occurs in the vicinity of the operating voltage corresponding to the maximum reverse current.

In a preferred embodiment, the compensation circuit comprises an amplifier, preferably a linear amplifier such as an operational amplifier, to provide the gradually-sloped current, together with a clamping circuit to clamp the transitional current at a maximum value and a zero value.

Embodiments of the present invention further disclose a class D amplifier comprising a compensation circuit to compensate for the reverse current. The compensation circuit creates an as-needed current load for the power supply based on the values of the output voltage of the amplifier. In a preferred embodiment, the compensation circuit can be added into the LDO power supply in a class D amplifier circuit to prevent the amplifier's reverse supply current from causing the amplifier's supply voltage to rise uncontrollably. The disclosed class D amplifier circuit may be used in a media player to generate audio signals through headphones, speakers, or other audio transducers.

Embodiments of the present invention can also be used in conjunction with other compensation circuits such as energy storage, DC loading, differential drive or push-pull voltage source.

DETAILED DESCRIPTION OF THE INVENTION

Embodiments of the present invention disclose a methodology and circuits to prevent the reverse current which flows back to the power supply in a modulator, especially in a class D modulator, from forcing the amplifier's supply voltage to rise uncontrollably. Recognizing that the reverse current is a function of the output voltage and phase, embodiments of the present invention discloses a compensation circuit providing a compensation current for the reverse current with the compensation current controlled by the output voltage amplitude and phase.

One embodiment of the present invention compensation circuit thus comprises a modeling of the reverse current from the modulator, and then using the reverse IV relationship between the reverse current and the output voltage to design a compensation circuit with a compensation IV transfer function matching the reverse IV relationship with the output voltage and phase as the control signal. Since the reverse current is a function of the output load voltage and phase, the compensation circuit according to the present invention can be tailored to fit the reverse current of a particular circuitry, minimizing power loss due to overcompensation.

Figure 1:
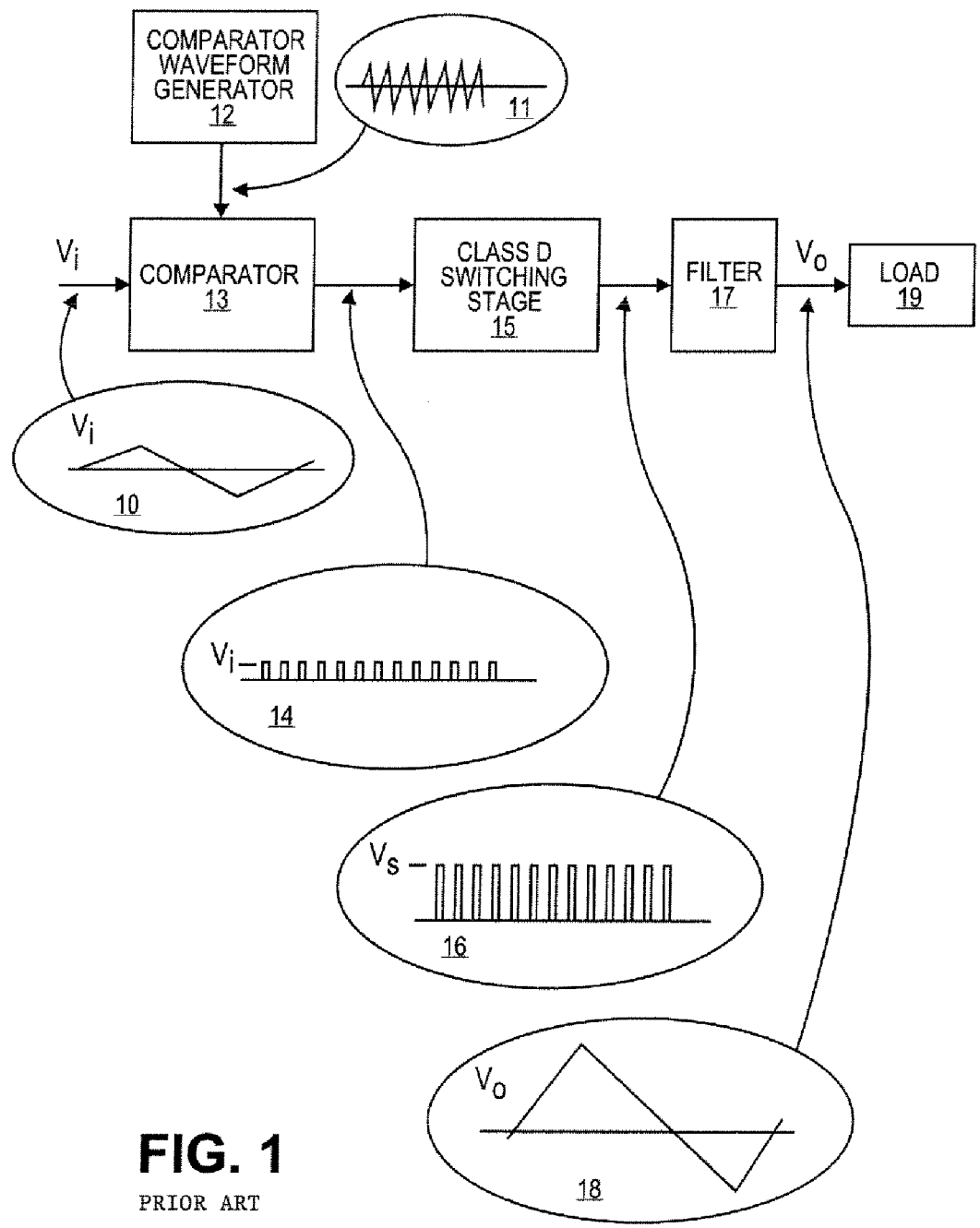
FIG. 1 shows a prior art schematic of a class D amplifier.
Figure 2:
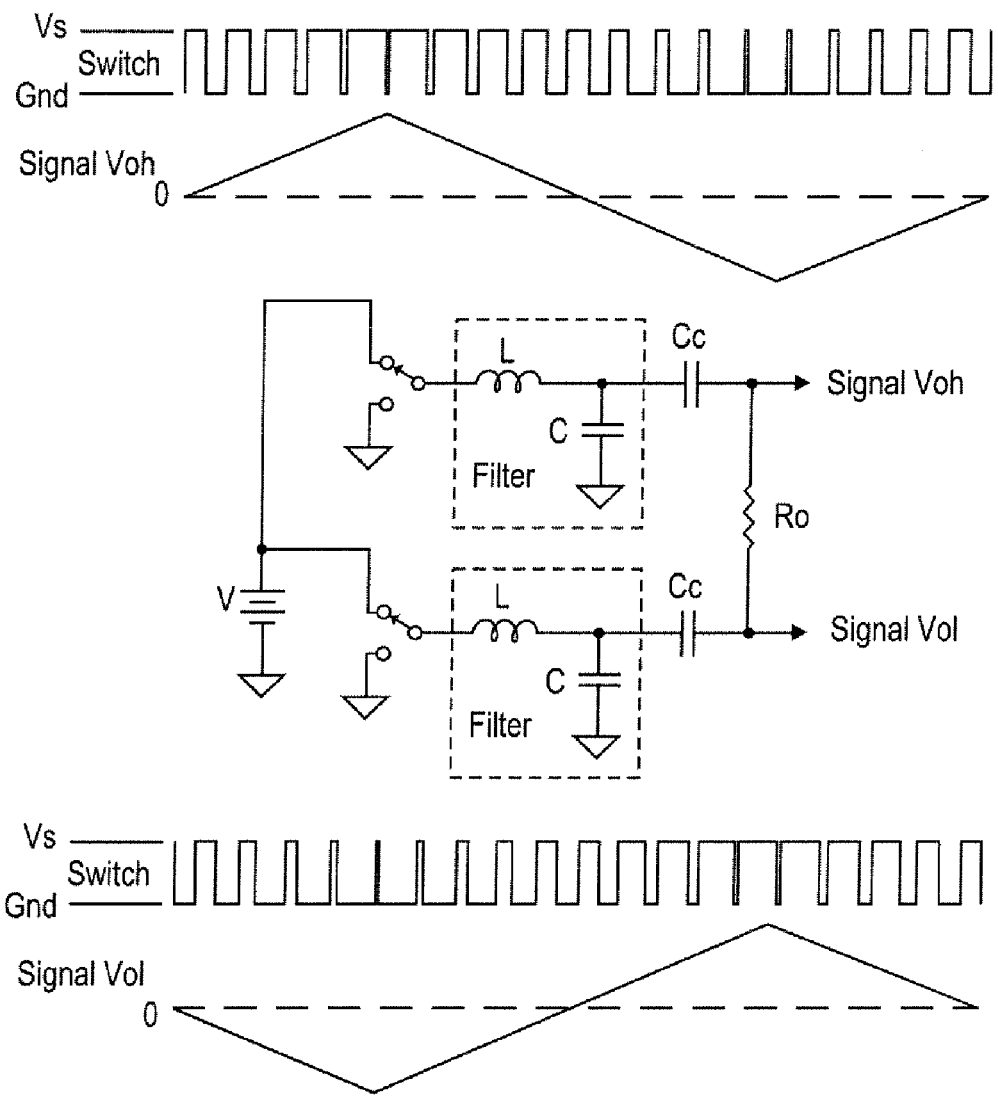
FIG. 2 shows a prior art reverse current solution for differential loading.
Figure 3:
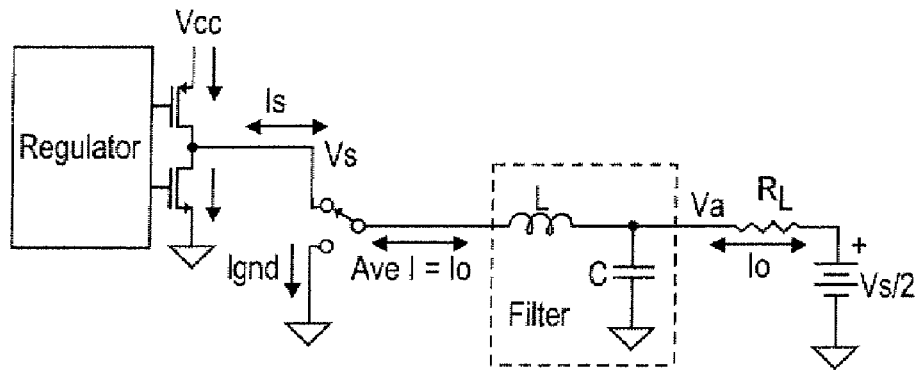
FIG. 3 shows a prior art reverse current solution using a push-pull voltage source.
Figure 4:
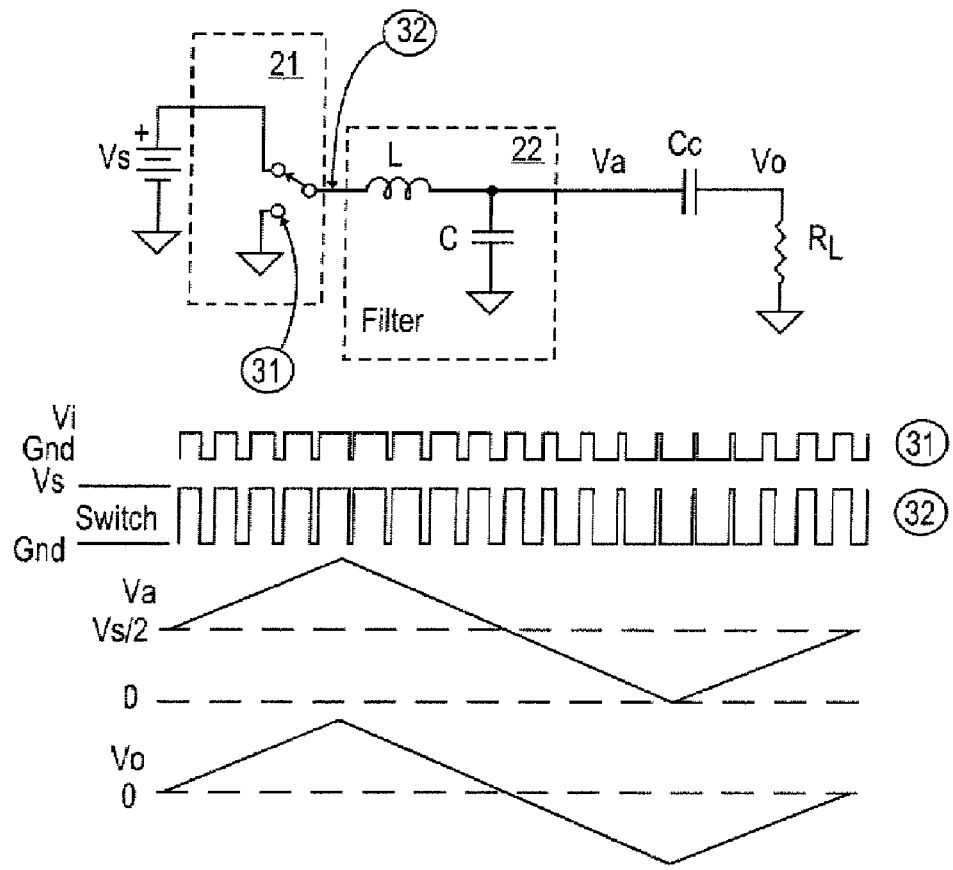
FIG. 4 shows a schematic of a class D amplifier with various waveforms.

The following section provides an exemplary modeling of the reverse current in a modulator circuit. Shown in FIG. 4 is a typical schematic of a class D amplifier, comprising a power supply Vs, a switching stage 21 driven by a modulated signal 31, a filter 22, and a load 23, together with the signal waveforms.

The switching circuit 21 is controlled by a PWM modulated 0-Vi pulse signal 31, which is generated from a modulation logic in an earlier stage. The modulated signal 31 is digitally amplified by the switching circuit 21 to become an amplified modulated 0-Vs pulse signal 32. The amplified modulated signal 32 retains the same pulse form as the modulated signal 31, but with the amplitude amplified from Vi to Vs. The amplified modulated signal 32 is then recovered with an LC filter 22 that must remove the high frequencies of the modulation and pass the signal frequencies. The low pass LC filter 22 is designed to pass the frequencies of interest, which in this case is audio frequencies and typically in the range of 10 to 30 kHz. The digital signal 32 becomes an analog signal Va after passing through the low pass filter 22, with the voltage amplitude being Vs times the duty cycle, where the duty cycle is defined as the time that switch is connected to Vs divided by the period of the (fixed) modulating digital frequency.

Figure 5:
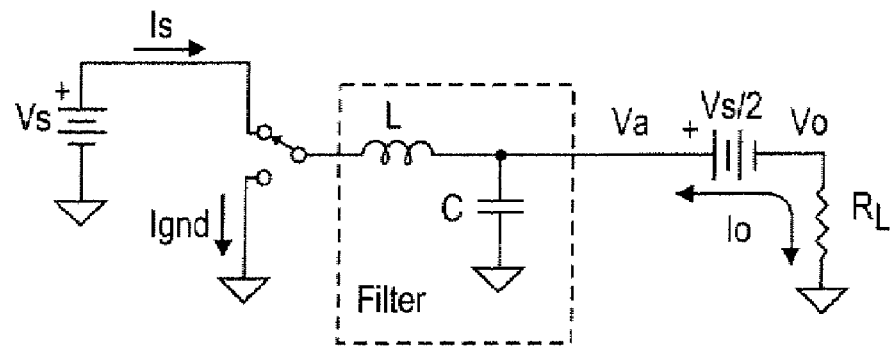
FIG. 5 shows a model of a coupling capacitor in a class D amplifier.
Figure 5:
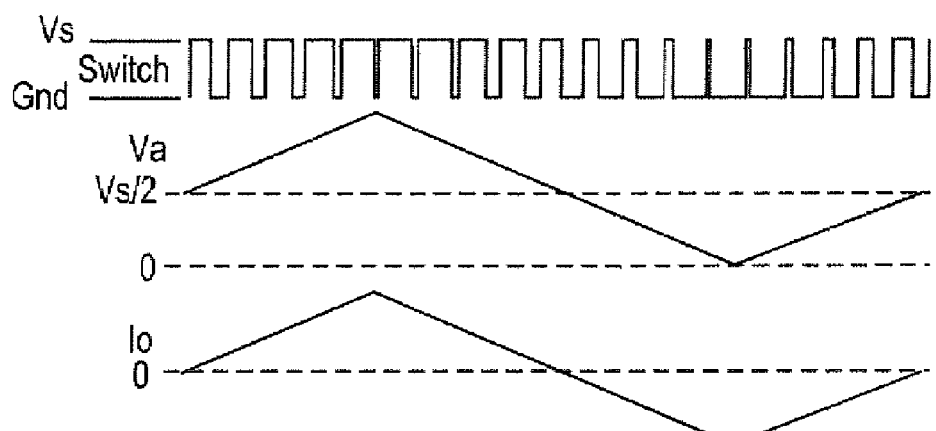

Depending on the design, the signal Va in FIG. 5 may or may not have a DC component. In this example, signal Va has a DC component. A coupling capacitor Cc can be used to remove the DC component, resulting in an AC signal Vo at the load resistor, RL.

A major advantage of class D amplifier is that it can be very efficient, since the switching amplifier 21 can be practically lossless. This example shows a basic class D amplifier, however, in practice, class D amplifiers can further include feedback circuits, or design improvement circuits to remove non-linearities, timing errors, unwanted component characteristics, parasitic components, or power supply fluctuation in the modulation, filter or power supply circuits.

Another cause of degradation in class D amplifier is bus pumping (or reverse current, or sinking current) where current from the load flows back into the power supply. The current in a class D amplifier is typically bi-directional, meaning there is times where the circuit sends current back to the power supply, which is a predictable artifact of the architecture. If the power supply cannot absorb the reverse current, the supply voltage pumps up, creating major power supply fluctuations. Since the gain of a class D amplifier is directly proportional to the power supply Vs, any fluctuation in Vs produces signal distortion.

The origin of bi-directional supply current of the circuit is illustrated as follows. As shown in FIG. 5, assuming symmetrical signal such as audio signals, the DC component of the signal would be Vs/2, thus the coupling capacitor Cc will charge up to Vs/2, and can be modeled by a Vs/2 battery. This substitution serves to simplify the calculation of the load current Io through the load $R_L$. Replacing Cc with a battery equal to Vs/2 and swapping its placement with RL, as in FIG. 6, it is now apparent that the voltage across $R_L$, and hence the current through it (Io), is both positive and negative.

Figure 6:
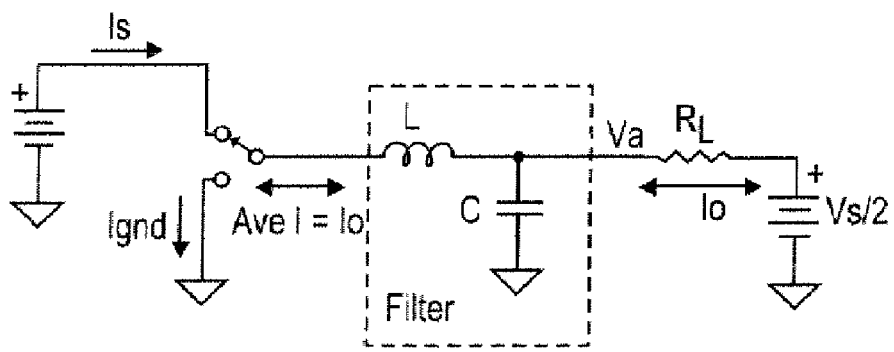
FIG. 6 shows another model of a coupling capacitor in a class D amplifier.

The current Io shown in FIG. 6 is a time-average current through an ideal lossless circuit, resulting from the filtering of the modulated signal. Other currents, for example the current through the inductor, can exhibit instantaneous response when the switching circuit switches between ground and Vs. For practical circuits, Io would include a loss current component $I_{LOSS}$.

From the simplified circuit of FIG. 5 or FIG. 6, the current Io is calculated to be:

$$Io = \frac{Va - \frac{Vs}{2}}{R_L} = \frac{Va}{R_L} - \frac{Vs}{2R_L}$$

In any lossless buck switching regulator, the input power equals the output power, or [1]

Power in = $Vs * Is$ = power out = $Va * Io$, so $$Is = \frac{Va}{Vs}Io = \frac{Va}{Vs}\left(\frac{Va}{R_L} - \frac{Vs}{2R_L}\right)$$

or $$Is = \frac{Va^2}{Vs \cdot R_L} - \frac{Va}{2R_L}$$

Figure 7:
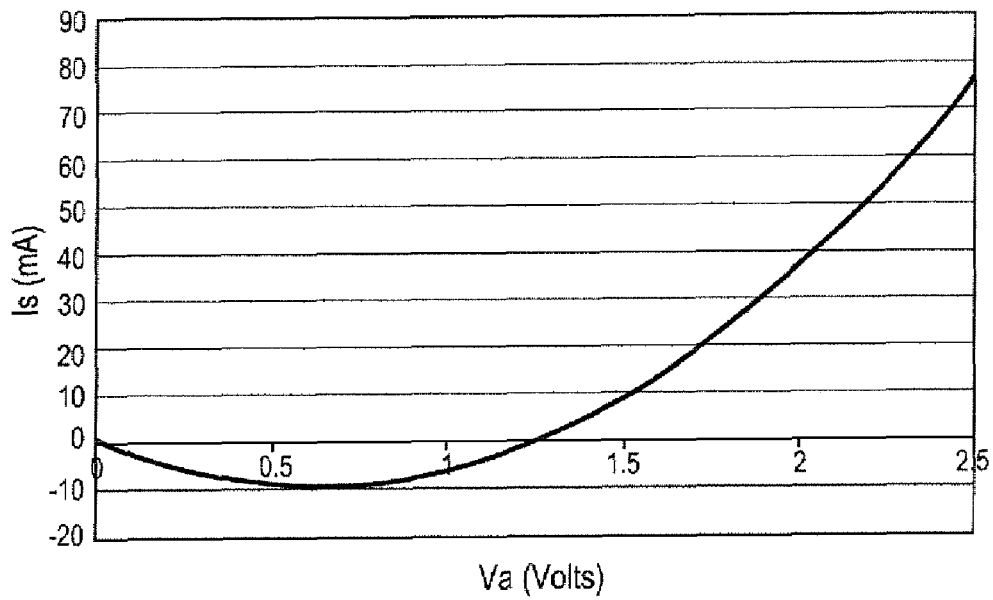
FIG. 7 shows a reverse IV relationship for output voltage before a coupling capacitor.

FIG. 7 shows a typical plot of this Is-Va curve for Vs=2.5 V and $R_L$=16Ω. This plot illustrates that for the operating voltage range of 0-2.5V, the power source must be able to source (deliver) about 80 mA and sink (receive) about 10 mA with the sinking current flowing backward to the power supply.

Figure 8:
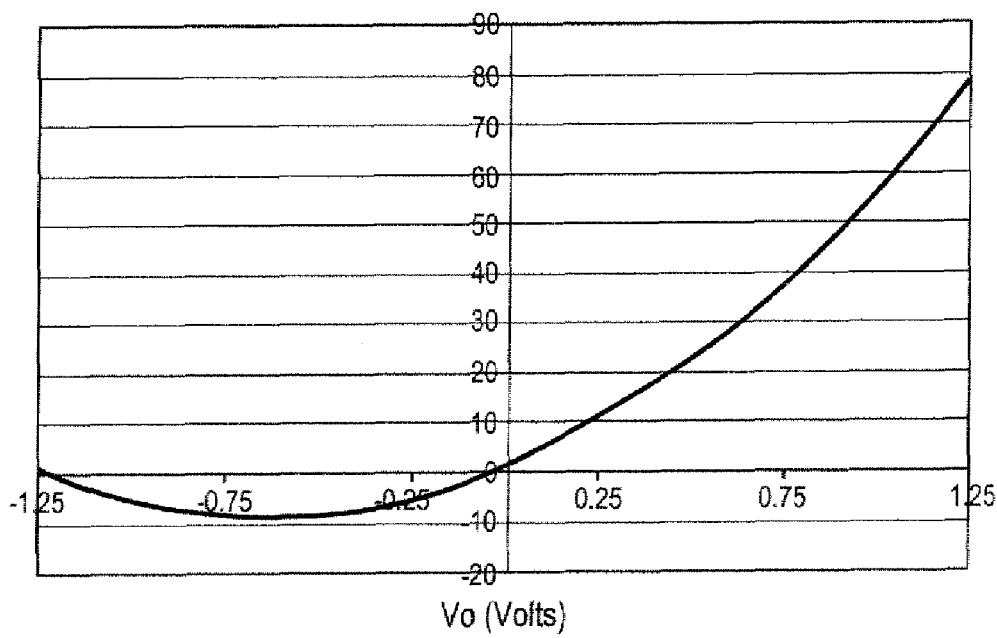
FIG. 8 shows a reverse IV relationship for a load output voltage.

Presuming a loss current $I_{LOSS}$ due to the inefficiency of the circuit, and re-writing the supply current Is in terms of the load voltage Vo, the supply current Is becomes:

$$Is = \frac{Vo^2}{R_L \cdot Vs} + \frac{Vo}{2R_L} + I_{LOSS} \quad [2]$$

and the corresponding Is-Vo curve is shown in FIG. 8 for Vs=2.5 V and $R_L$=16Ω.

The source of the class D amplifier's reverse power supply current is now obvious from FIG. 8. The compensation of this sinking or reverse current is one of the goals of the present invention, since this reverse current when using with a LDO power supply will cause supply voltage fluctuation, creating output signal distortion.

With the reverse Is-Vo relationship known, a compensation circuit can be designed and incorporated into the power supply to completely compensate the reverse current, to shunt the reverse current away from the class D amp's power supply to ensure that the power supply always has a positive drain.

The transfer function for the compensation circuit is modeled from the reverse IV relationship, and thus is best optimized when the two curves, the reverse IV relationship and the compensation IV relationship, are perfectly matched so that the resulting power supply current is zero whenever the circuit exhibits reverse current, for the whole range of operating output voltages.

In a preferred embodiment, the compensation circuit is conservatively designed, using a higher compensation current than the reverse current in a certain range of operating voltages, to account for component and circuit variations.

A higher compensation current than the corresponding class D amplifier reverse current means that the amplitude of the compensation current is higher than the amplitude of the reverse current, and therefore the net current out of the LDO is positive, defined as the current flowing out from the power supply. One goal of the invention is to always maintain a positive current out of the LDO in order to keep the LDO's output voltage within regulation.

In another preferred embodiment, the compensation circuit is designed so that the compensation IV relationship matches the reverse IV relationship for only a predetermined range of operating output voltages. The compensation circuit is much easier to design for a smaller matching range, in exchange for a higher power loss. Therefore the present invention allows the trade-off between circuit performance and circuit simplicity by restricting the matching for only a portion of the operating output voltages, preferably for the operating output voltage range in the vicinity of zero volts.

For a positive load, there is no reverse current for the range of positive output load voltage. Thus the present invention further discloses that the compensation circuit provides zero compensation current in the range of positive output voltages.

In another preferred embodiment, the present invention also discloses a universal compensation circuit, suitable for many modulator circuits with only a few design constraints. The disclosed compensation circuit comprises a zero compensation current in the positive output voltage range, a constant compensation current in the negative output voltage range, and a transition current, gradually connecting the constant compensation current with the zero compensation current. The constant compensation current preferably matches the maximum reverse current to ensure positive total supply current. The compensation current is positive to compensate for the negative reverse current, thus the transition current gradually decreases from the maximum reverse current to a zero current with respect to an increase in output voltage. The transition IV curve is preferably linear for ease of circuit design, with a slope matching that of the reverse IV relationship. The transfer function of the compensation circuit becomes a three-segment relationship, resembling a gradually-sloped stepping function. Since the compensation current and the reverse current have opposite polarity with respect to a given voltage, slope matching means the matching of the magnitude of the slope values of the two compensation and reverse IV curves.

Figure 9:
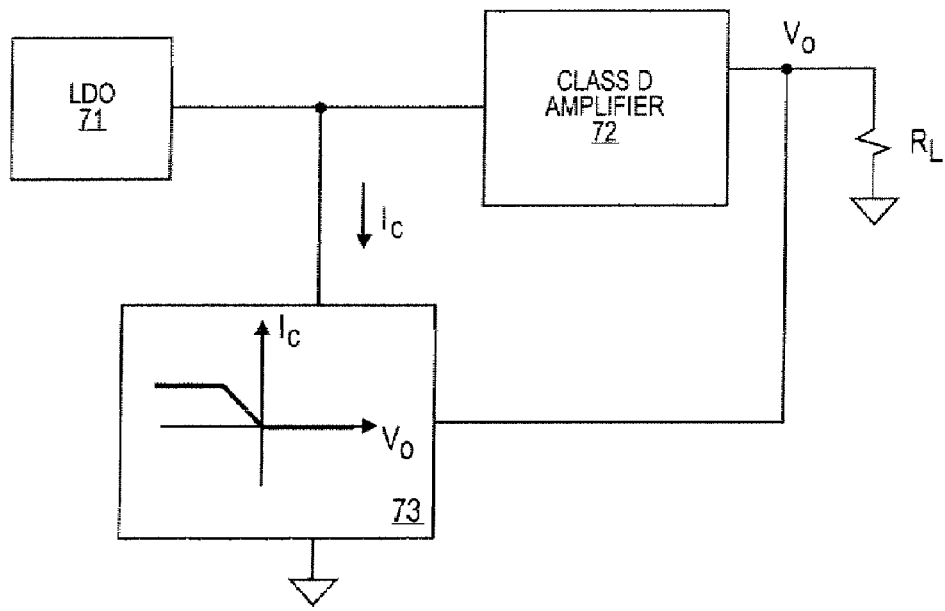
FIG. 9 shows an embodiment of the present invention compensation circuit for a class D amplifier.

FIG. 9 shows a preferred embodiment of the present invention compensation circuit 73 employing three-segment compensation IV relationship. The compensation circuit 73 provides a compensation load from the power supply LDO 71, compensating for a reverse current from the class D amplifier 72, with a control voltage being the load output voltage Vo, taken from the circuit load $R_L$. The compensation circuit 73 comprises a control input from the output voltage Vo to control a current Ic from the power supply LDO to the ground. The transfer function Ic-Vo of the compensation circuit comprises a three-segment IV relationship: a constant current in the negative voltage range, a zero current in the positive voltage range, and a gradually decreasing, preferably linear, current in the transition range from the negative to the positive voltage. The constant compensation current is preferably equal to the maximum reverse current, and the slope of the transition segment is preferably equal to the slope of the reverse IV relationship. These constraints are served to select the components of the compensation circuit.

Figure 10:
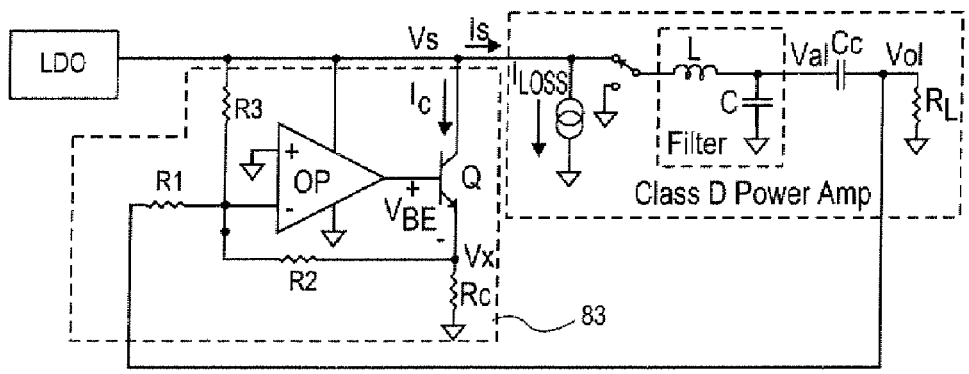
FIG. 10 shows a schematic of a compensation circuit for a class D amplifier according to the present invention.

FIG. 10 shows an exemplary circuit detail of the three-segment compensation circuit. A power supply LDO provides power to the class D power amplifier and also to the compensation circuit 83. The schematic for the class D amplifier is similar to that of FIG. 4, with the addition of a loss current source $I_{LOSS}$ to represent the inefficiencies of the amplifier circuit. The compensation circuit 83 comprises a resistive compensation load Rc, controlled by a transistor switch Q and a linear operational amplifier OP. There are three ranges of operation voltages, controlled by the output voltage Vo, all controlled by the transistor switch Q and the op amp OP. Transistor Q provides a clamping function at both sides of the linear amplification curve of the operational amplifier OP, generating the desired three-segment transfer function.

The compensation circuit can only sink current due to the presence of transistor Q; it is incapable of sourcing current. Thus when the voltage V−, the voltage at the input of op amp OA's negative input, is greater than zero volts, the output Vx is clamped at zero volts, forcing the compensation current Ic to be zero. The range of output voltages for which the compensation current equals zero is determined by resistors R1 and R3 as follows:

If $V-\geqq 0$ then $$\frac{Vs}{R3} \geq -\frac{Vo}{R1}$$

or $$Vo \geq -\frac{Vs \cdot R1}{R3}$$

Thus, for the compensation circuit 83, the compensation current Ic is zero when the output voltage Vo is more positive than $-(Vs \cdot R1)/R3$.

When $Vo < -(Vs \cdot R1)/R3$, the operational amplifier OP starts operating, with the current through resistor R2 is the sum of the current through R1 and R3. For op amp analysis, V− is held at virtual ground and can be considered to be zero, thus $$\frac{Vx}{R2} = -\frac{Vo}{R1} - \frac{Vs}{R3}$$

or $$Ic = -\frac{R2}{Rc}\left(\frac{Vo}{R1} + \frac{Vs}{R3}\right)$$

The upper limit of the compensation current provided by the compensation circuit occurs when op amp OA's output voltage reaches its maximum output voltage, Vs, thus limiting the compensation current Ic to a maximum value:

$$Ic\max = \frac{Vs - V_{BE}}{Rc} = -\frac{R2}{Rc}\left(\frac{Vox}{R1} + \frac{Vs}{R3}\right)$$

or $$Vox = -\frac{Vs \cdot R3}{R2} - \frac{R1}{R2}(Vs - V_{BE}) \approx -\frac{R1}{R2}(Vs - V_{BE})$$

where Vox is the value of Vo where Icmax is reached. Thus the compensation current Ic is clamped also when $Vo < -(VS - V_{BE})R1/R2$.

Thus the disclosed compensation circuit provides three-segment compensation current Ic with respect to the output voltage Vo:

$$Ic = 0 \qquad \text{for } Vo \geq -\frac{Vs \cdot R1}{R3}$$

$$Ic = -\frac{R2}{Rc}\left(\frac{Vo}{R1} + \frac{Vs}{R3}\right) \quad \text{for } -\frac{Vs \cdot R1}{R3} \geq Vo \geq -\frac{R1}{R2}(Vs - V_{BE})$$

$$Ic = \frac{Vs - V_{Be}}{Rc} \qquad \text{for } Vo \leq -\frac{R1}{R2}(Vs - V_{BE})$$

An embodiment of the present invention further discloses a design criterion for the three-segment compensation current by matching the compensation with the reverse current of the power supply. In particular, the design criterion specifies that the slope of the compensation current matches with the slope of the reverse current, the compensation should start when the reverse current starts, and the constant compensation matches the peak reverse current.

The slope of the compensation current can be conservatively approximated by the slope of the reverse current of [2] at I=0 with no $I_{LOSS}$. This gives the relationship of $$\frac{R2}{Rc \cdot R1} = \frac{1}{2R_L} \qquad [3]$$

or $$\frac{R2}{R1} = \frac{Rc}{2R_L}$$

The output voltage Vo where the compensation current starts is set to be where the reverse current starts, thus when Is=0, from [2]

$$Vo = -\frac{Vs}{4} + \frac{V2}{2}\left(\frac{1}{4} - \frac{4R_L}{Vs} \cdot I_{LOSS}\right)^{\frac{1}{2}}$$

The compensation current starts when $Vo = -(Vs \cdot R1)/R3$, thus $$\frac{R1}{R3} = \frac{1}{4} - \frac{1}{2}\left(\frac{1}{4} - \frac{4R_L}{Vs} \cdot I_{LOSS}\right)^{\frac{1}{2}}$$

An alternative way to conservatively approximate this criterion is to introduce the loss current $I_{LOSS}$ to the compensation current, and then starts the compensation current at Vo=0 and Ic=0:

$$Ic = -\frac{R2}{Rc}\left(\frac{Vo}{R1} + \frac{Vs}{R3}\right) + I_{LOSS} \quad [4]$$

At $Vo = 0$ and $Ic = 0$:

$$\frac{R2}{R3} = \frac{Rc \cdot I_{LOSS}}{Vs}$$

The peak reverse current can be calculated from equation [2]

$$I_{PEAK} = -\frac{Vs}{16R_L} + I_{LOSS}$$

and this peak current matches the constant compensation current $$I_{PEAK} = -\frac{Vs}{16R_L} + I_{LOSS} = \frac{Vs - V_{BE}}{Rc} \quad [5]$$

or $$Rc = \frac{16R_L(Vs - V_{BE})}{Vs - 16R_L \cdot I_{LOSS}}$$

Figure 11:
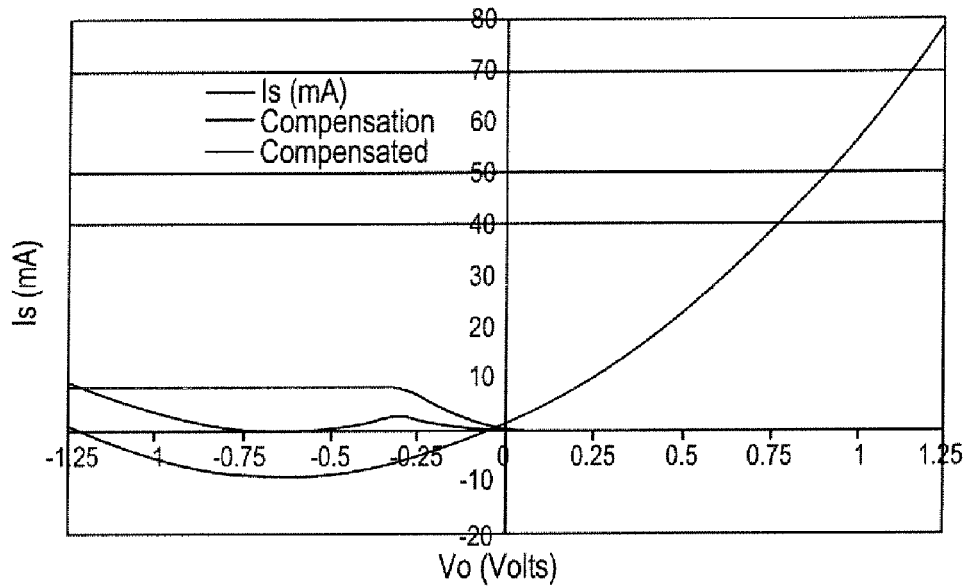
FIG. 11 shows the compensation current and the total current from the power supply according to an embodiment of the present invention compensation circuit for a class D amplifier.

Equations [3], [4], and [5] provide the design relationships for the correction circuit design. FIG. 11 illustrates a desired compensation current and the resulting compensated current for Vs=2.5 V and $R_L$=16Ω.

Figure 12:
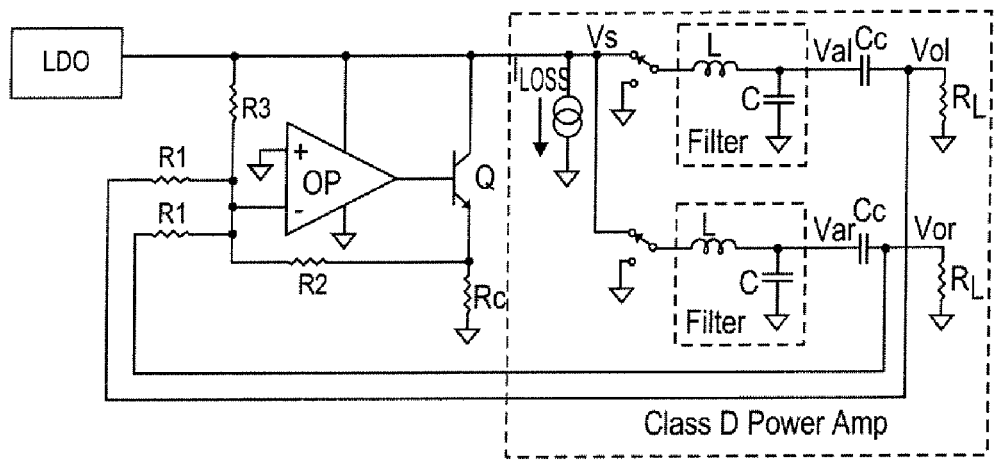
FIG. 12 shows a schematic of a compensation circuit for a dual amplifier for stereo audio headphone applications.

The present invention compensation circuit can be extended to dual amplifiers, shown in FIG. 12 for a complete class D solution for a dual amplifier for stereo audio headphone applications. The design relationships for this circuit using the components illustrated are as followed, employing dual output voltage Vol and Vor:

$$\frac{R2}{R1} = \frac{Rc}{2R_L} \quad [6]$$

$$\frac{R2}{R3} = \frac{Rc \cdot I_{LOSS}}{Vs} \quad [7]$$

$$Rc = \frac{8R_L(Vs - V_{BE})}{Vs - 8R_L \cdot I_{LOSS}} \quad [8]$$

Embodiments of the present invention further disclose a class D amplifier which comprises a compensation circuit coupled to an output of a source of power (power supply) and to an output of the amplifier. The compensation circuit creates an as-needed current load for the power supply based on the values of the output of the class D amplifier. The power supply is typically a LDO power supply regulator circuit, and the compensation circuit prevents any substantial reverse current from effecting the operation of the LDO power supply. In effect, the compensation circuit acts as a load which is added to the LDO and class D amplifier loads when there is any substantial reverse current.

Figure 13:
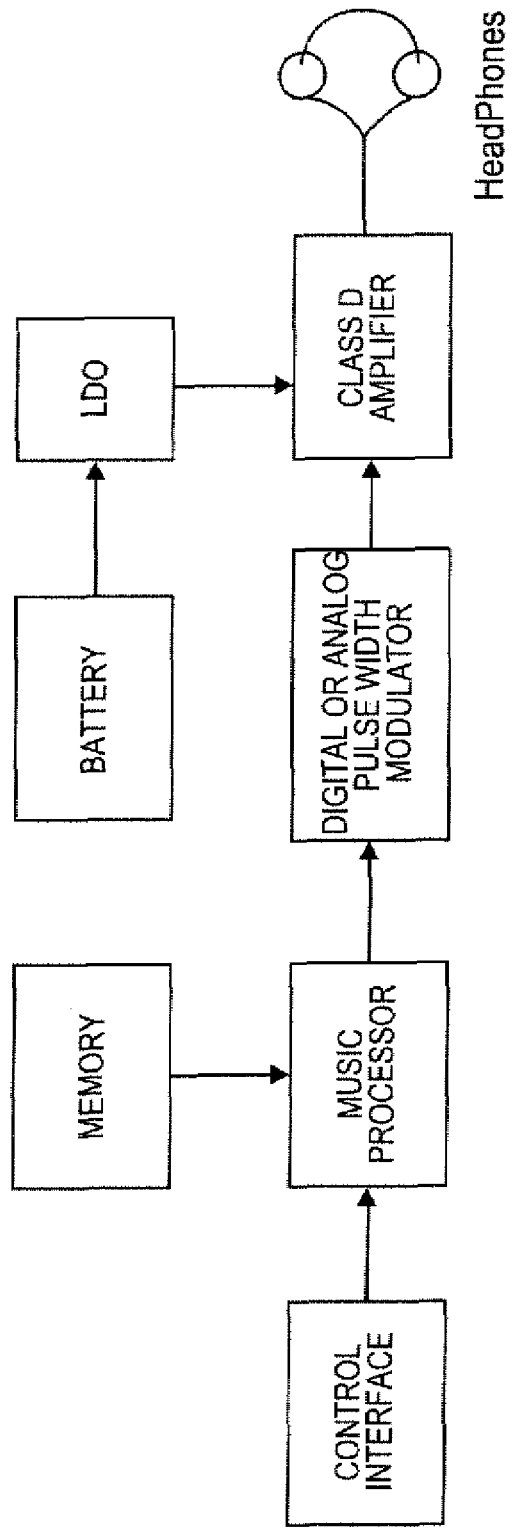
FIG. 13 shows a block diagram of an exemplary embodiment for a media player according to the present invention.

In certain embodiments, the LDO, compensation circuit, and the class D amplifier circuit may be used in a media (e.g. music) player to generate audio power (e.g. the class D amplifier may drive headphones or other audio transducers). An example of such a media player is shown in FIG. 13, in which the LDO receives power from a battery to provide regulated power to the class D amplifier, which includes the compensation circuit in the implementation. The regulated power source could also be derived from any form of switching power supply; thus with appropriate LDOs, one battery can serve all needed power voltage requirements. Therefore the battery shown can be shared with other circuits. The PWM signal is applied to the input of the class D amplifier which outputs a signal to the stereo headphones. The music processor may retrieve music or other media from the memory, in response to a user input on the control interface, and cause a digital stream, representing the music to be modulated by the digital (or analog) pulse width modulator to be generated to drive the input to the class D amplifier.

What is claimed is:

1. A method for compensating for reverse power supply current of a modulator, the method comprising:
generating a voltage-dependent compensation current for the power supply to compensate for the reverse current, the compensation current controlled by an output voltage of the modulator circuit.

2. A method as in claim 1 wherein the reverse current is compensated by providing a higher magnitude of the compensation current than that of the reverse current for a predetermined range of output voltages.

3. A method as in claim 1 wherein the magnitude of the compensation current is always higher than the magnitude of the reverse current for the whole range of operating output voltages of the modulator circuit.

4. A method as in claim 1 wherein the relationship between the compensation current and the output voltage matches a reverse IV relationship between the reverse current and the output voltage for a predetermined range of output voltages.

5. A method as in claim 4 wherein the matching comprises a degree of similarity between the two relationships.

6. A compensation circuit coupled to a power supply and to a modulator circuit,
wherein the power supply provides power to the modulator circuit, and
wherein the modulator circuit comprises an output,
the compensation circuit sinking current on a pattern in which the compensation circuit sinks in one mode and does not sink in another mode.

7. A circuit as in claim 6 wherein the sinking current of the compensation circuit compensates for a reverse current to the power supply from the modulator circuit for a predetermined range of output voltages.

8. A circuit as in claim 6 wherein the reverse current is compensated by providing a sinking current having a higher magnitude than that of the reverse current.

9. A compensation circuit for compensating a reverse current of a power supply in a modulator circuit, the compensation circuit comprising:
a voltage-dependent load coupled to the power supply, the voltage-dependent load controlled by an output voltage of the modulator circuit;
wherein the compensation load is controlled by the output voltage with a compensation IV relationship comprising:
a zero compensation current section corresponding to a positive output voltage,
a constant compensation current section corresponding to a negative output voltage, and a transition compensation current section connecting the zero compensation current section and the constant compensation current section.

10. A circuit as in claim 9 wherein the magnitude of the constant compensation current is higher than that of the maximum reverse current.

11. A circuit as in claim 9 wherein the transition compensation current is substantially linear from the constant compensation current to the zero compensation current.

12. A circuit as in claim 9 wherein the slope of the transition compensation current matches that of the reverse current.

13. A circuit as in claim 9 wherein the transition from the transition compensation current to the zero compensation current is in the vicinity of the zero output voltage of the modulator circuit.

14. A compensation circuit for compensating a reverse current of a power supply in a modulator circuit, the compensation circuit comprising:
- a compensation load coupled to the power supply;
- a control circuit to control a compensation current through the compensation load, the control circuit comprising:
  - a linear amplifier circuit having an input coupled to the output voltage of the modulator circuit and a control output coupled to the compensation load;
  - a clamping circuit coupled to the control output and to the compensation load to limit a compensation current through the compensation load between a constant value and zero value.

15. A circuit as in claim 14 wherein the power supply is a LDO power supply.

16. A circuit as in claim 14 wherein the modulator circuit comprises a single-ended load.

17. A circuit as in claim 14 wherein the modulator circuit comprises a single or a dual class D amplifier.

18. A circuit as in claim 14 wherein the compensation load comprises a resistor.

19. A circuit as in claim 14 wherein the linear amplifier circuit comprises an operational amplifier.

20. A circuit as in claim 14 further comprising a voltage divider circuit coupled between the output voltage of the modulator circuit and the input of the linear amplifier.

21. A circuit as in claim 14 wherein the clamping circuit comprises a transistor device.

22. A class D amplifier comprising a compensation circuit for compensating a reverse current of a power supply coupled to the amplifier, the compensation circuit coupled to the power supply and to the amplifier and sinking current on a pattern in which the compensation circuit sinks in one mode and does not sink in another mode.

23. A class D amplifier comprising a compensation circuit for compensating a reverse current of a power supply coupled to the amplifier, the compensation circuit comprising:
- a compensation load coupled to the power supply;
- a control circuit to control a compensation current through the compensation load, the control circuit comprising:
  - a linear amplifier circuit having an input coupled to the output voltage of the amplifier and a control output coupled to the compensation load;
  - a clamping circuit coupled to the control output and to the compensation load to limit a compensation current through the compensation load between a constant value and zero value.

24. A processor coupled to a class D amplifier, the processor presenting media through the class D amplifier, the class D amplifier comprising:
- a compensation circuit for compensating a reverse current of a power supply coupled to the amplifier,
- the compensation circuit coupled to the power supply and to the amplifier and sinking current on a pattern in which the compensation circuit sinks in one mode and does not sink in another mode.

25. A media player comprising a class D amplifier, the class D amplifier comprising:
- a compensation circuit for compensating a reverse current of a power supply coupled to the amplifier,
- the compensation circuit coupled to the power supply and to the amplifier and sinking current on a pattern in which the compensation circuit sinks in one mode and does not sink in another mode.

26. A media player comprising a class D amplifier, the class D amplifier comprising a compensation circuit for compensating a reverse current of a power supply coupled to the amplifier, the compensation circuit comprising:
- a compensation load coupled to the power supply;
- a control circuit to control a compensation current through the compensation load, the control circuit comprising:
  - a linear amplifier circuit having an input coupled to the output voltage of the amplifier and a control output coupled to the compensation load;
  - a clamping circuit coupled to the control output and to the compensation load to limit a compensation current through the compensation load between a constant value and zero value.

* * * * *